United States Patent [19]

Takahashi et al.

[11] 4,447,856
[45] May 8, 1984

[54] SHELF UNIT FOR ELECTRONIC COMMUNICATION DEVICES

[75] Inventors: Yoshihiro Takahashi; Katsuo Okuyama, both of Kawasaki; Yutaka Matsukuma, Hatano, all of Japan

[73] Assignee: Fujitsu Limited, Kawasaki, Japan

[21] Appl. No.: 314,427

[22] Filed: Oct. 23, 1981

[51] Int. Cl.³ .............................................. H05K 7/20
[52] U.S. Cl. .................... 361/383; 361/415; 165/DIG. 5; 62/418
[58] Field of Search .............. 165/DIG. 5, 122, 80 B, 165/80 D; 62/418; 174/15 R, 16 R; 211/41; 361/381–384, 390, 391, 393–396, 399, 415, 386

[56] References Cited

U.S. PATENT DOCUMENTS

| 3,019,620 | 2/1962 | Constantini | 62/418 |
| 3,298,195 | 1/1967 | Rashodoff | 62/418 |
| 3,299,664 | 1/1967 | Booth | 62/418 |
| 3,730,264 | 5/1973 | Krylow | 165/128 |
| 4,158,875 | 6/1979 | Tajima | 361/384 |
| 4,293,891 | 10/1981 | Matsui | 361/383 |

OTHER PUBLICATIONS

The Cited Ericsson Review #2, 1976, "New Packaging Structure for Electronic Switching Equipm.
Also Ericsson Tel. Sw. Sys. AXE 10, 1976, pp. 48–57.
Japan Publication #(Unexamined Patent) 53-136901, 11/29/78.

Primary Examiner—G. P. Tolin
Attorney, Agent, or Firm—Staas & Halsey

[57] ABSTRACT

Electronic communication device shelf units for packing therein printed circuit boards wherein the shelf units are to be put one upon another in a cabinet, wherein each said shelf unit comprises hollow side plates provided with air inlet openings on their outer faces, and a top plate which is connected to the side plates and having a V-shaped heat diffusion plate defining thereon an air introduction space; the side plates are provided, on their inner faces, with openings communicating with the air introduction space, such that hot air diffusion for each shelf unit is independent of the other shelf units.

29 Claims, 17 Drawing Figures

SHELF UNIT FOR ELECTRONIC COMMUNICATION DEVICES

BACKGROUND OF THE INVENTION

This invention relates to an electronic communication device shelf unit for mounting or packaging printed circuit boards thereto or therein, and also to an assembly composed of the shelf units put one on another.

Generally, shelf units for mounting printed circuit boards thereto are put one upon another and arranged side by side in a matrix arrangement, for example in a cabinet, to give a beautiful appearance or to protect from foreign substances, such as dust, and to provide a framed device. Electronic components provided on a printed circuit board (which will be referred to as a PC board hereinafter) generate heat, and as a result a collection of PC boards generate a large amount of heat. It is, therefore, very important to effectively radiate or diffuse this large amount of heat out of the frame device.

For the purpose of radiating of heat from the frame device in a conventional frame device, a heat diffusing inclined plate is provided on the top of each of the shelf units. Hot air from the shelf units flows upwards in the shelf units to the inclined plates and then flows along the inclined plates so that the hot air is introduced into spaces between the shelf units and the cabinet. The hot air in the spaces which are connected to a common vertical extending chimney passage is collected in an upper space of the cabinet, due to the so-called chimney effect. The hot air collected in the upper space of the cabinet is finally discharged out of the cabinet through a number of outlet windows or openings provided on an upper plate of the cabinet.

However, this means of radiating of hot air according to the prior art, wherein the hot air from all the shelf units is collected at one place, i.e. at the upper space of the cabinet, tends to free the upper space with hot air, which thus results in a great difference in temperature between the top and the bottom of the cabinet. It should be noted that the allowable maximum value of the amount of generated heat for the whole frame device depends on the temperature of the hot air in the upper space of the cabinet, because the temperature in the upper space of the cabinet is highest. Therefore, an allowable maximum value of the amount of generated heat for a PC board is limited to a lower value, which thus results in an undersirable limitation on the PC board. This limitation means a decrease in the packaging density of the electric components on the PC board.

Furthermore, in the prior art arrangement, although a number of outlet windows or openings are provided not only on the top cover of the cabinet, but also on side plates of the cabinet, almost all of the hot air can be radiated only through the outlet windows on the top cover, since the hot air having a high temperature flows in an upward direction in the cabinet. Therefore, ineffective heat radiation can be expected from the prior art arrangement, which is one of the reasons that the hot air tends to remain in the cabinet.

SUMMARY OF THE INVENTION

The primary object of the present invention is, therefore, to provide a shelf unit for electronic communication not having the disadvantages mentioned above by using hot air diffusing systems which are independent from one another for every shelf unit so that hot air is radiated from every shelf unit.

Another object of the present invention is to provide a shelf unit which is strong enough to support another identical shelf unit and which is easily filed upon another identical shelf unit to provide an assembly of shelf units.

Still another object of the present invention is to provide an assembly composed of shelf units which are superimposed and/or arranged side by side in a cabinet.

According to one of the features of the present invention, each shelf unit has an independent heat diffusion system so that the hot air in one shelf unit is independent from that of an adjacent shelf unit.

Other features, additional objects and many of the attendant advantages of this invention will be readily appreciated as the same becomes better understood by reference to the following detailed description of preferred embodiments when considered in connection with the appended drawings:

DESCRIPTION OF THE PREFERRED EMBODIMENTS

Figure 1:
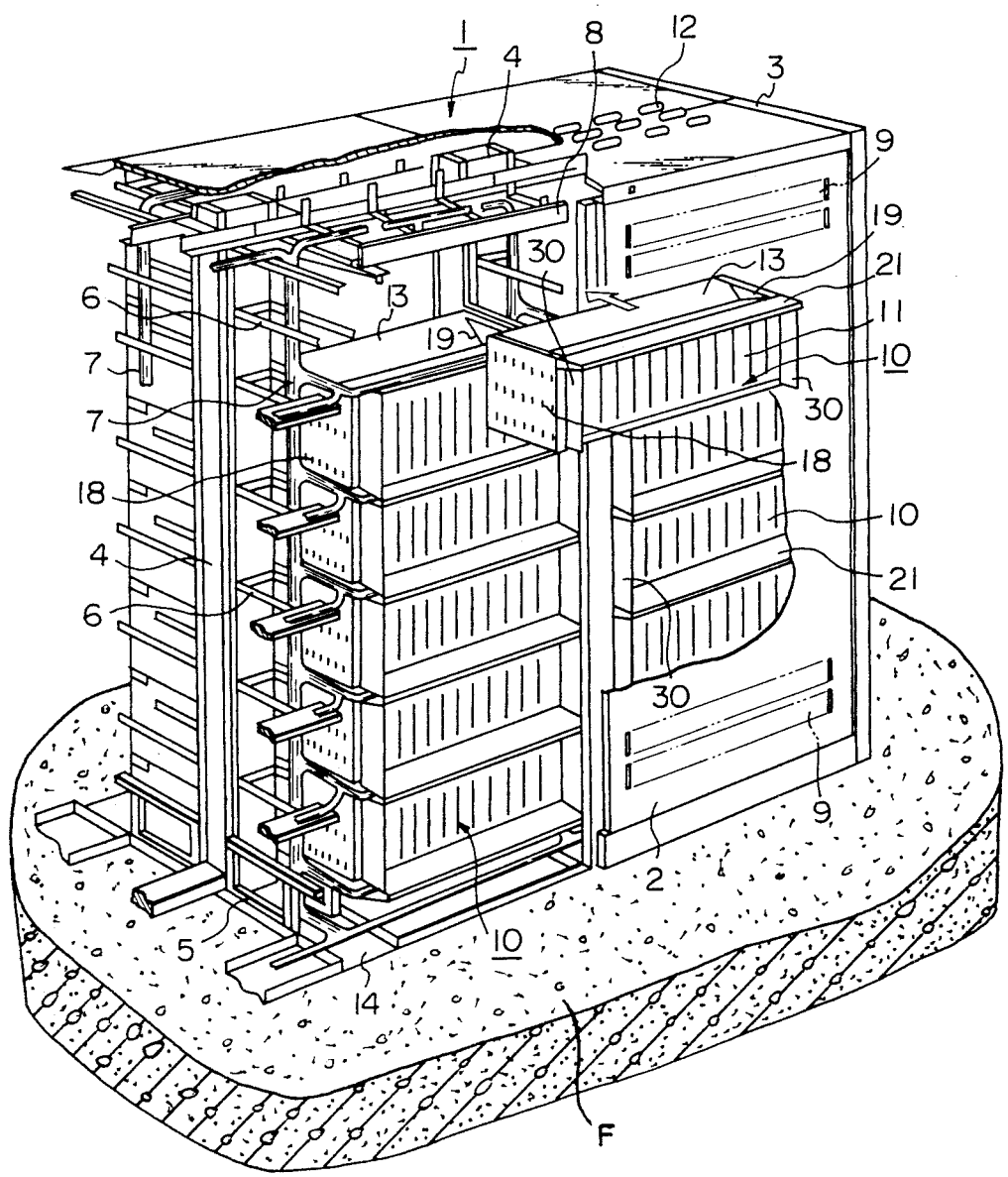
FIG. 1 is a partially cut-away, perspective view of a shelf unit assembly according to the present invention.

First, with reference to FIGS. 1–6, in a cabinet 1 are arranged a plurality of shelf units 10 of the invention in rows and columns. That is, the shelf units 10 are superimposed in rows and located side by side. The number of the rows and columns are not limited to those of the illustrated embodiment. In the arrangement shown in FIG. 1, the shelf units 10 are arranged in a matrix arrangement, on both sides, i.e. the front and rear sides of the cabinet, respectively. The cabinet has front and rear doors 2 (only one front door is shown) corresponding to the columns of the shelf units. Each of the doors can be opened and closed at its one side or end. The opposite ends of the cabinet 1 are closed by end plates (side panels) 3, only one of which is shown in FIG. 1.

A predetermined number of vertical posts 4 are provided in the cabinet 1. The posts 4 are secured, for example, to a floor of a building by means of base plates 14 which can be removably secured, for example, to the lower ends of the posts 4 by means of bolts (not shown). On the base plates 14 are provided base supports 5 on which the lowest shelf unit 10 is mounted. The shelf units 10 can be removably attached to the posts 4. To the posts 4 are secured generally U-shaped cable guide brackets 6 in which cables 7 extend in vertical and horizontal directions to be connected to printed circuit boards 11 inserted in the shelf units 10. The cables 7 are supported by cable supports 8 provided on the upper ends of the posts 4 to be connected to an external main distribute frame (MDF) and power supply (not shown).

Figure 4:
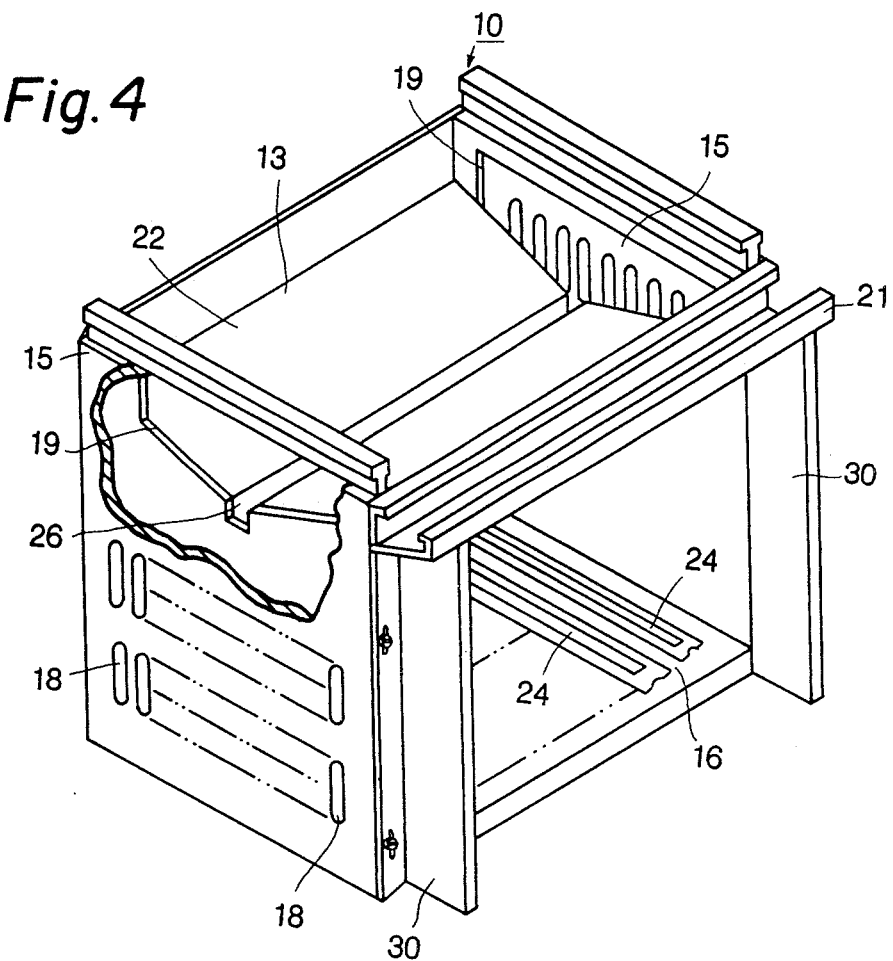
FIG. 4 is a perspective view of a shelf unit according to the present invention.
Figure 5:
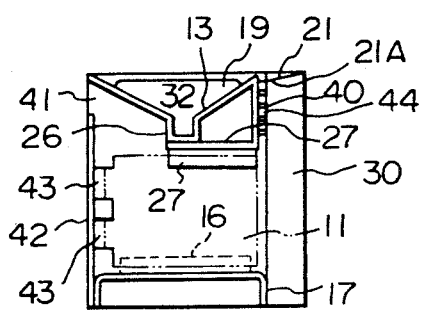
FIG. 5 is a sectional side view of the shelf unit of FIG. 4.

As best seen in FIGS. 4 and 5, the shelf unit 10 in which the PC boards 11 are arranged has a pair of hollow side plates 15, a bottom plate 17 which has lower guide rails 16 for the PC boards, and a generally V-shaped top plate 13. The side plates 15 are provided, on their outer side faces, with a number of air openings 18, and on their inner side faces, with generally triangular windows 19, so that cool air coming into the side plates 15 through the openings 18 can be diffused in an upper space 22 provided on the top plate 13 through the windows 19. The upper space 22 provides a cool air introducing space for feeding the cool air to an adjacent shelf unit which is to be put on the shelf unit having the upper space 22.

For the purpose of introducing cool air to an upper shelf unit from a lower adjacent shelf unit, the bottom plate 17 of each shelf unit has a number of openings 24 which are defined between and by the lower guide rails 16, so that the cool air from the upper space 22 of a shelf unit enters the upper adjacent shelf unit resting on the first mentioned shelf unit through the bottom openings 24 thereof and flows in and through the upper shelf unit while absorbing the heat of the PC boards 11.

The top plate 13 has a generally V-shaped cross-section and preferably has a center flat bottom wall portion 26 resting on upper guide rails 27 which correspond to the lower guide rails 16 and have, for example, U-shaped guide channels (not shown) provided therein, so that the PC boards 11 can be inserted in the shelf unit, with the help of the upper and lower guide rails 27 and 16.

The flat bottom wall portion 26 need not be provided when the upper guide rails 27 are not provided. The guide rails 27 can be integrally formed by bending the top plate 13. Four alternate embodiments of the profile of the top plate 13 are schematically shown in FIGS. 14A-14D, two of which have no flat bottom wall portion.

On one side of the top plate 13 is provided an upper projecting overhang 21 which extends and comes into contact with an inner face of the corresponding door 2 of the cabinet 1. The overhangs 21 may be members integral with or separate from the top plate 13. The overhangs 21 define heat diffusion spaces 35 (FIG. 2) between the shelf units 10 and the corresponding doors 2 which are closed. The heat diffusion spaces 35 of the two adjacent shelf units are separated from one another by means of the overhangs 21 extending in horizontal directions.

Figure 2:
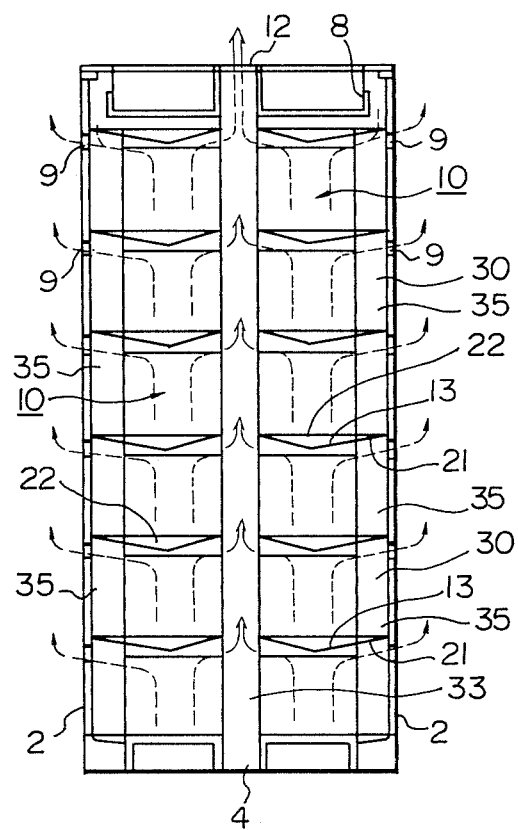
FIG. 2 is a schematic sectional side view of FIG. 1.
Figure 3:
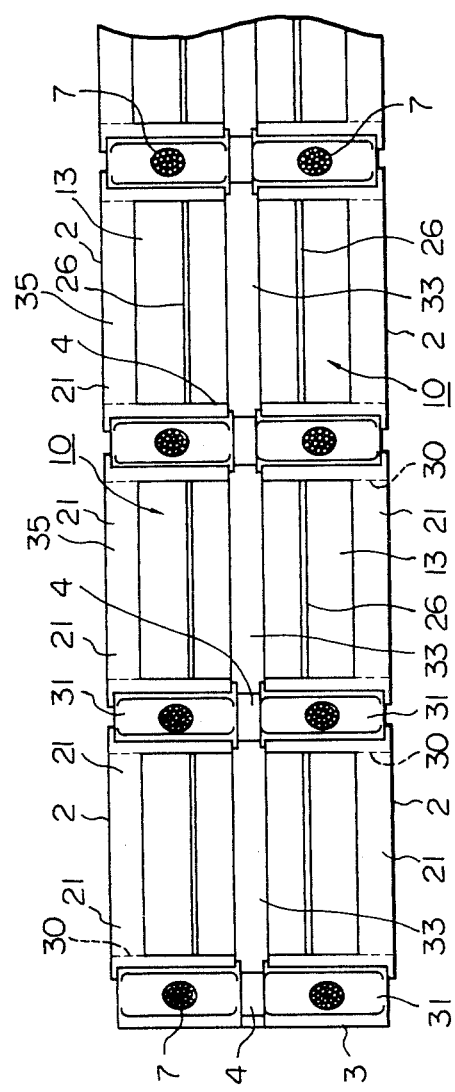
FIG. 3 is a schematic sectional plan view of FIG. 1.
Figure 6:
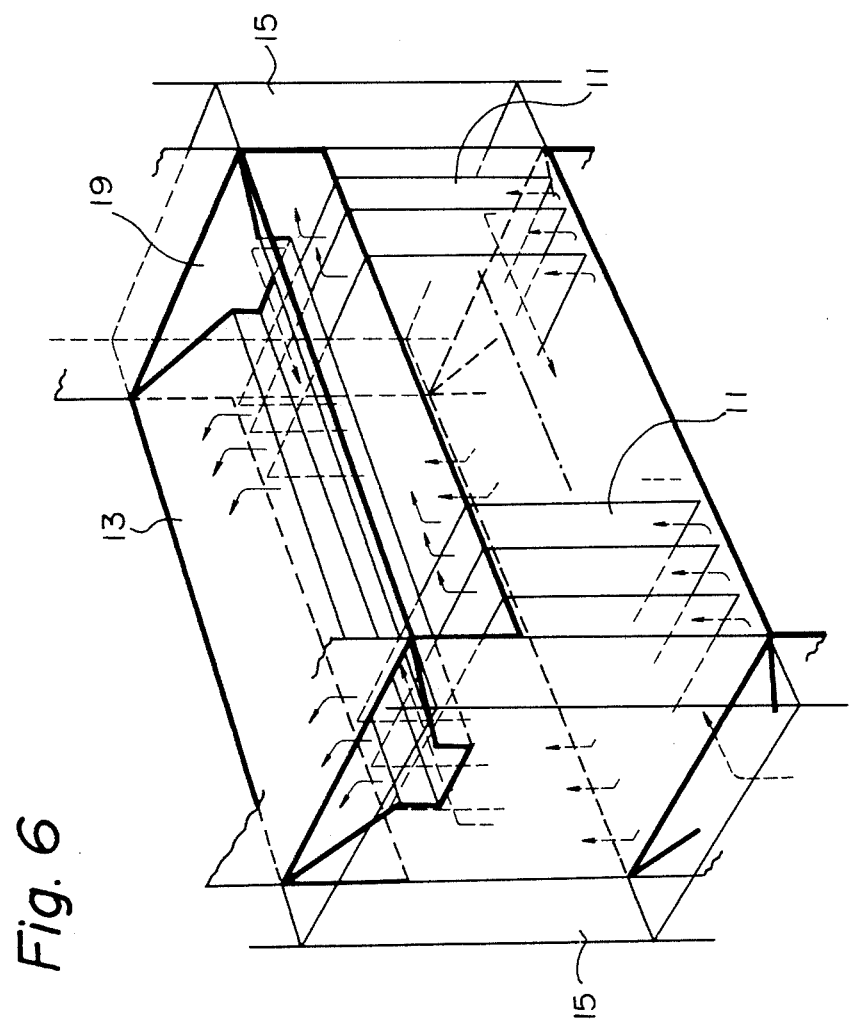
FIG. 6 is a schematic perspective view of a shelf unit showing the direction of flow of hot air.

The air introduced through the upper space 22 of the shelf unit comes into the adjacent upper shelf unit through the bottom openings 24 of the latter and flows upwards into the upper shelf unit, while absorbing the heat radiated from the PC boards 11 in the upper shelf unit. The hot air reaches the top plate 13 of the upper shelf unit and is then diffused outwards by the top plate 13 which forms an inclined heat radiating means. The hot air flows along the inclination of the top plate 13 and further flows along the projecting overhangs 21 to the corresponding door 2. Finally the hot air is discharged outside the cabinet by outlet openings 9 provided on the doors 2. The flow of the air is schematically illustrated in FIGS. 2 and 6.

The projecting overhangs 21, form extensions of the associated inclined top plates 13, and, accordingly, have inclined inner surfaces 21A, preferably connected to the associated inclined top plates 13.

Preferably, in order to make air diffusion systems of adjacent shelf units in horizontal directions independent from one another, separation plates 30 are provided on the side plates 15 of each shelf unit 10. The separation plates 30 project by a length equal to the projecting length of the overhang 21 so that the separation plates 30 come into contact with the inner surface of the associated door 2 of the cabinet 1 when the door 2 is closed. The heat diffusing space 35 is defined and closed by the overhang 21 and the two separation plates 30. Thus, the heat diffusion spaces 35 are independent of one another for every shelf unit 10, and, accordingly, the hot air in the shelf unit does not come into or flow into an adjacent shelf unit.

When no rear group of shelf units are provided in the cabinet, that is, when shelf units 10 are arranged only on the front side of the cabinet, in a matrix arrangement, the overhangs 21 and the separation plates 30 are provided not only on the front side of the shelf unit but also on the rear side of the shelf unit, so that the hot air can be evenly discharged outside the cabinet from the front door 2 and the rear doors (not shown).

However, in many cases, the front group of shelf units and the rear group of shelf units are usually arranged in the cabinet 1 in a tandem fashion, so that the rear sides of the shelf units 10 of the front group are opposite the rear sides of the shelf units 10 of the rear group, as shown in FIGS. 1 and 2. Therefore, it is not necessary to provide the overhang 21 and the sepration plates 30 on the rear side of each shelf unit 10. In such a tandem arrangement, the hot air which flows along the top plates 13 toward the rear or inner sides of the shelf units, i.e. toward the posts 4 of the cabinet 1, is collected in common vertical spaces 33 (FIG. 3) defined by the posts 4. The hot air flows upwards and is finally discharged outside the cabinet from a number of outlet openings 12 provided on the ceiling plate of the cabinet 1. Between two adjacent shelf units 10 arranged side by side are provided spaces 31 (FIG. 3) in which the cables 7 are arranged. The spaces 31 also serve as cool air introduction spaces.

On a rear side of the shelf unit 10 there is provided a backboard 42 which is secured to the side plates 15 and which is connected to the inserted PC boards 11 by means of connectors 43. In the backboard 42 there is provided a space 41 through which the hot air is brought into the common space 33.

A reinforcement wall 44 may be provided on an upper portion of the front side of the shelf unit 10, in the vicinity of the top plate 13. Openings 40 then must be formed in the reinforcement wall 44 so that the hot air flowing along the top plate flows through the openings 40 and comes to the openings 9 of the associated door 2.

Figure 7:
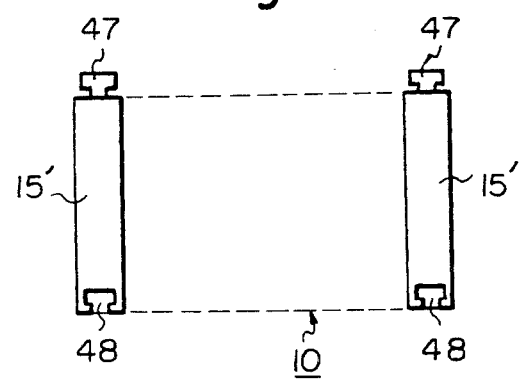
FIG. 7 is a schematic elevational view of a part of a shelf unit according to another embodiment of the present invention.

In a modified embodiment shown in FIG. 7, the shelf unit 10 has side plates 15' which are provided, on their upper ends, with male members consisting of T-shaped guide rails 47 and, on their lower ends, with female members consisting of guide channels 48 complementary to the guide rails 47. The male member is not limited to the T-shaped guide rail but may be of another shape, such as rectangular, polygonal, circular or dovetail. The female member has a shape in cross-section complementary to the male member so that the male member can be fitted in the female member. Furthermore, contrary to the arrangement mentioned above, the female members can be provided on the upper ends of the side plate 15' and the male members can be provided on the lower ends of the side plates 15'.

According to the construction shown in FIG. 7, when the shelf units are put one upon another, the upper shelf unit is slid onto the lower shelf unit while engaging the male and female members. When the side plates 15' have a thickness or strength enough to support the shelf units put thereon without the help of any rack or any frame, such as the posts 4 shown in FIG. 1, the shelf units themselves form a frame device. That is, no additional frame device is necessary to prepare an assembly of shelf units. The male members 47 may be integral with or separate from the respective side plates 15'.

Figure 8:
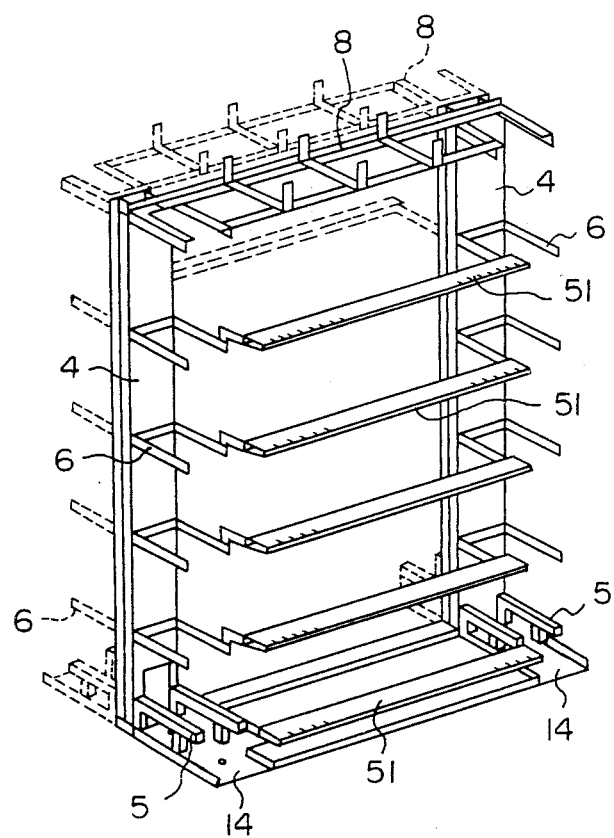
FIG. 8 is a perspective view of a cable guide structure according to the present invention.
Figure 9:
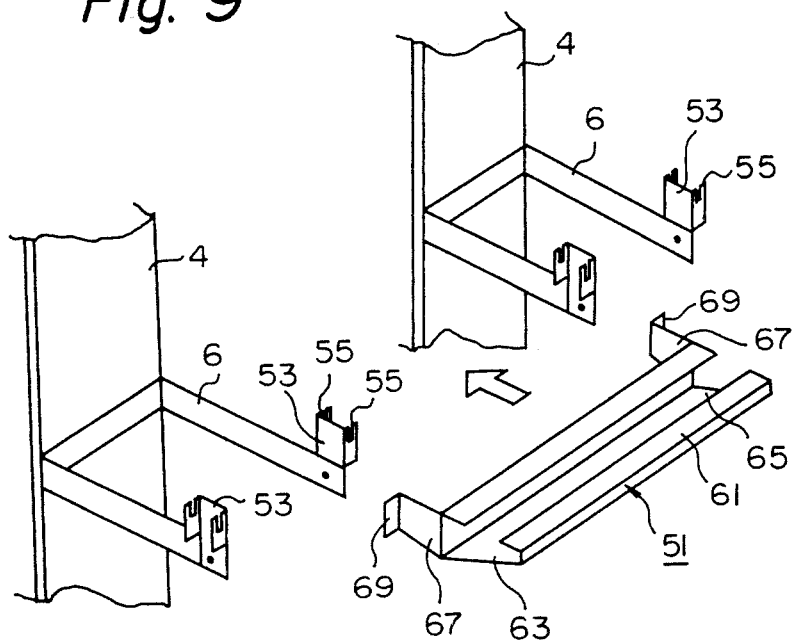
FIG. 9 is an enlarged view of a cable direct assemble of FIG. 8.

In an embodiment illustrated in FIGS. 8 and 9, the modification is mainly directed to the overhang 21 (FIGS. 1–6) which is replaced by a cable duct 51. The cable duct 51 is not integral with the shelf unit, unlike the embodiment shown in FIGS. 1–6, but is a separate member. The cable duct 51 can be easily detachably mounted to the cable guide brackets 6. The U-shaped cable guide bracket 6 has, at its front ends, mountings 53 which are secured thereto. Each mounting 53 has two grooves 55 aligned horizontally.

The cable duct 51 is made of a profile member 61 extending between the pair of brackets 6. The profile member 61 has an inclined bottom wall 63 which serves as an overhang equivalent to the overhang 21 (FIG. 4) when the cable duct 51 is mounted onto the brackets 6. The profile member 61 has side plates 67 which are connected to the ends of the profile member 61 and which extend perpendicularly to the length of the profile member 61. The side plates 67 have bent ends 69 which prevent the side plates 67 from coming out of the grooves 55 of the associated small plates 57 when the side plates 67 are fitted into the grooves 55. The two outermost mountings 53 shown in FIG. 9 are used for the two laterally adjacent cable shelves (not shown). In the arrangement shown in FIGS. 8 and 9, no overhang 21 is provided on the shelf unit 10. The cables 7 extend in grooves 65 defined by the profile members 61.

When two shelf units are placed one upon another, the cable duct 51 may be an obstacle to slide the shelf unit onto the other. Of course, every time shelf units are located on adjacent lower shelf units, an operator may move the associated cable ducts slightly upward so that the latter do not interfere with the sliding movement of the shelf unit on the adjacent lower shelf unit. However, since the bottom wall 63 of the cable duct 51 is inclined, similar to the overhang 21 shown in FIG. 4, the shelf unit can be slid onto the adjacent lower shelf unit, while moving the cable shelf upward along the inclination of the bottom wall 63.

The cables 7 can be easily connected to connectors 11A (FIG. 11) of the PC boards 11 in the shelf units 10, at the front sides of the shelf units 10.

Figure 10:
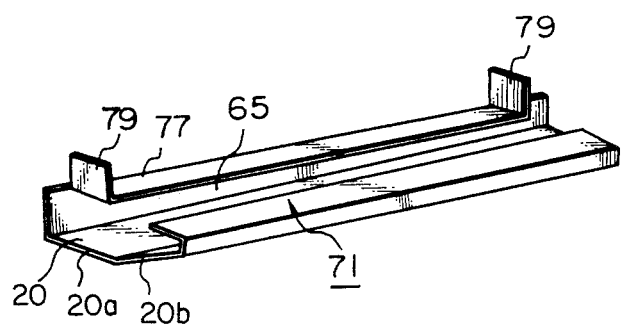
FIG. 10 is a perspective view of an alternate embodiment of the cable duct.
Figure 11:
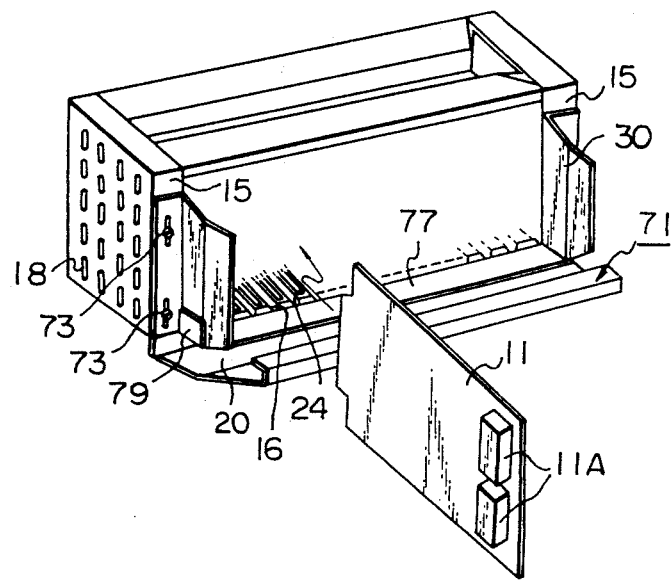
FIG. 11 is a perspective view of a shelf unit, to which a cable duct shown in FIG. 10 is attached, and a printed circuit board for insertion into the shelf unit.
Figure 12:
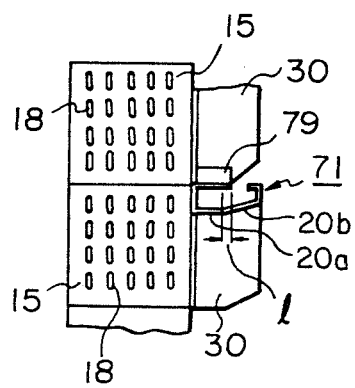
FIG. 12 is a side elevational view of the shelf unit of FIG. 11.

In the embodiment illustrated in FIGS. 10–12, a cable duct 71, which is equivalent to the cable duct 51 in FIG. 9, is detachably mounted to the separation plates 30 at the lower end of the shelf unit 10. The separation plates 30 are secured to the side plates 15 of the shelf unit 10 by means of set screws 73. The cable duct 71, which has a profile similar to that of the cable duct 51, has additional upright tongues 79 bent on an upper ridge 77 of the cable duct 71. The distance between the upright tongues 79 is substantially the same as the distance between the pair of separation plates 30, so that the separation plates 30 are held by and between the tongues 79 to attach the cable duct to the shelf unit without any securing means, such as a bolt or screw. The cable duct 71 is also held by and on the separation plates 30 of the lower shelf unit when the shelf units are put one on another, as shown in FIG. 12. Furthermore, the cable duct 71 has a bottom plate 20 consisting of a flat horizontal portion 20a and an inclined portion 20b connected thereto. The width of the upper ridge 77 is larger than that of the flat portion 20a by "l" (FIG. 12). The separation plate 30 has an upper profile corresponding to the bottom plate 13, so that when the cable duct 71 is located on the separation plates 30 of the lower self unit, the cable duct 71 cannot move in the clockwise direction as illustrated in FIG. 12, that is, the cable duct 71 does not come out from the associated separation plates 30. The cables 7 are easily arranged in the cable ducts due to the presence of the inclined portion of the lower edge of the separation plates 30. Alternatively, it is also possible to provide the upright tongues 79 located between the separation plates 30 of the associated shelf unit.

Figure 13:
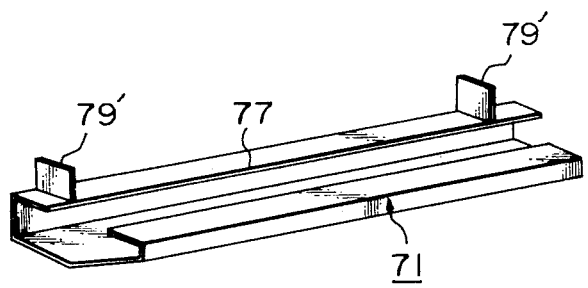
FIG. 13 is a perspective view of an alternate embodiment of the cable duct shown in FIG. 10, and, FIG. 14A–14D show four alternate embodiments of inclined heat diffusing plates having different profiles.
Figures 14A, 14B:
Figures 14C, 14D:

In a modification shown in FIG. 13, the bent upright tongues 79 of the upper ridge 77 in FIG. 10 are replaced by separate upright tongues 79' which are secured to the upper ridge 77 of the cable duct.

It should also be noted that a number of shelf units according to the present invention may be assembled with, conventional shelf units in which hot air radiation systems are not independent from one another in view of the non-uniform amount of heat radiation of the shelf units which may have different kinds of electronic components.

We claim:

1. An electronic communication device shelf unit having means for mounting printed circuit boards therein, wherein the shelf unit has means for mounting itself upon another shelf unit, said shelf unit comprises: hollow side plates which are provided, on their outer faces, with air inlet openings; and a top plate which is connected to the side plates and which has an inclined heat diffusion plate defining thereon an air introduction space; and wherein said side plates are provided, on their inner faces, with openings communicating with the air introduction space.

2. A shelf unit according to claim 1, further comprising a bottom plate which is connected to the side plates and which has openings through which the air comes into the shelf unit.

3. A shelf unit according to claim 2, further comprising lower guide means on the bottom plate for guiding the insertion of the printed circuit boards into the shelf unit.

4. A shelf unit according to claim 3, further comprising upper guide means on the top plate for guiding the insertion of the printed circuit boards into the shelf unit.

5. A shelf unit according to claim 1, wherein said inclined heat diffusion plate is substantially V-shaped.

6. A shelf unit according to claim 1, further comprising an overhang outwardly projecting from the top plate.

7. A shelf unit according to claim 6, wherein said overhang comprises an inclined surface in an extension of the inclination of the heat diffusion plate.

8. A shelf unit according to claim 6, further comprising a pair of separation plates which are connected to the respective side plates and which project from the latter in the same direction as the overhang.

9. A shelf unit according to claim 2, further comprising a detachable overhang which outwardly projects from the bottom plate.

10. A shelf unit according to claim 9, further comprising separation plates connected to the side plates, wherein said overhang comprises tongues which can be engaged by and disengaged from the separation plates.

11. A shelf unit according to claim 10, wherein the shelf unit is put on top of a second substantially identical shelf unit and said overhang is located on the separation plates of the second shelf unit.

12. A shelf unit according to claim 1, wherein said side plates are provided, on their upper end, with male members and on their lower end, with female members which are complementary to the male members.

13. A shelf unit according to claim 1, wherein said side plates are provided, on their upper end, with female members and on their lower end, with male members which are complementary to the female members.

14. A shelf unit according to claim 1, wherein said top plate comprises a substantially "U"-shaped heat diffusion plate.

15. A shelf unit according to claim 5, wherein said "V"-shaped heat diffusion plate further comprises a center flat bottom wall portion.

16. A shelf unit according to claim 14 wherein said "U"-shaped heat diffusion plate further comprises a center flat bottom wall portion.

17. A shelf unit according to claim 1, further comprising printed circuit boards inserted into the shelf unit and a backboard covering substantially the rear side of the shelf unit and being connected to the side plates and the inserted printed circuit boards, which together define a space for diffusing air.

18. An assembly comprising: a frame device having a cabinet, a base, posts which are supported on the base, and cable guide means positioned in the cabinet; and a plurality of superimposed shelf units in the cabinet having means for mounting therein printed circuit boards, each shelf unit having hollow side plates which are provided, on their outer faces, with air inlet openings, a top plate which is connected to the side plates, and which has an inclined heat diffusion plate which defines thereon, together with an adjacent upper shelf unit, an air introduction space, said side plates being provide, on their inner faces, with openings communicating with the air introduction space, and a bottom plate which is connected to the side plates and which has openings through which the air comes into the shelf unit from the air introduction space under the bottom plate, whereby the air coming into the shelf units can be independently diffused from the respective shelf units.

19. An assembly according to claim 18, wherein said cabinet further comprises: a pair of side panels having air inlet openings opposite the side plates of the shelf units and a pair of front and back door panels having air outlet openings opposite the air introduction spaces of the shelf units.

20. An assembly according to claim 19, wherein said cable guide means comprises generally u-shaped cable brackets connected to the posts of the frame device.

21. An assembly according to claim 20, wherein each of said shelf units further comprises: an overhang which outwardly projects from the top plate and which comes into contact with the inner surface of the corresponding door panel, and separation plates which are connected to the side plates and which come into contact with the inner surface of the corresponding door panel.

22. An assembly according to claim 20, wherein each of said shelf units further comprises: a cable duct which can be detachably connected to the cable brackets and which is located between the bottom plate and the corresponding door panel to come into contact with the bottom plate and the door panel.

23. An assembly according to claim 16, wherein each of said shelf units further comprises: a pair of separation plates which are connected to the respective side plates and which come into contact with the corresponding door panel, and a cable duct which can be detachably connected to the separation plates and which is located between the bottom plate and corresponding door panel to come into contact with the bottom plate and the door panel.

24. An assembly according to claim 18 wherein said top plate comprises a substantially "V"-shaped heat diffusion plate.

25. An assembly according to claim 18 wherein said top plate comprises a substantially "U"-shaped heat diffusion plate.

26. An assembly according to claim 24 wherein said "V"-shaped heat diffusion plate further comprises a center flat bottom wall portion.

27. An assembly according to claim 25 wherein said "U"-shaped heat diffusion plate further comprises a center flat bottom wall portion.

28. An assembly according to claim 18, further comprising printed circuit boards inserted into the shelf unit and a backboard covering substantially the rear side of the shelf unit and being connected to the side plates and the inserted printed boards, which together define a space for diffusing air.

29. An assembly according to claim 23 wherein the detachable cable duct further comprises an upper ridge running parallel to the length of the detachable cable duct and having a pair of upright tongues for holding engagement against the respective separation plates.

* * * * *

UNITED STATES PATENT AND TRADEMARK OFFICE
CERTIFICATE OF CORRECTION

PATENT NO. : 4,447,856
DATED : 5/8/84
INVENTOR(S) : YOSHIHIRO TAKAHASHI ET AL.

It is certified that error appears in the above-identified patent and that said Letters Patent is hereby corrected as shown below:

Col. 1
Line 23, delete "of" (second occurrence).
Line 39, "free" s/b --fill--.
Line 50, "undersirable" s/b --undesirable--.
Line 67, after "tion" insert --devices,--.

Col 2
Line 20, ":" s/b --.--.
Line 39, "direct assemble" s/b --duct assembly--.
Line 55, "are" s/b --there is--.

Col. 4
Line 44, "sepration" s/b --separation--.

Col. 6
Line 21, ""1"" s/b --"$\ell$"--.
Line 23, "13," s/b --20,--.
Line 39, delete the comma --,--.
Line 40, "another" s/b --another,--.

Col. 7
Line 47, delete "and" (first occurrence).

Signed and Sealed this

Twenty-fifth Day of September 1984

[SEAL]

Attest:

GERALD J. MOSSINGHOFF

*Attesting Officer*   *Commissioner of Patents and Trademarks*

UNITED STATES PATENT AND TRADEMARK OFFICE
CERTIFICATE OF CORRECTION

PATENT NO. : 4,447,856
DATED : 5/8/84
INVENTOR(S) : YOSHIHIRO TAKAHASHI ET AL.

It is certified that error appears in the above-identified patent and that said Letters Patent is hereby corrected as shown below:

FRONT PAGE INSERT

--(30) Foreign Application Priority Data

Oct. 24, 1980    Japan    55-148145
    Oct. 24, 1980    Japan    55-148146 --

Signed and Sealed this

Twenty-sixth Day of March 1985

[SEAL]

Attest:

DONALD J. QUIGG

Attesting Officer    Acting Commissioner of Patents and Trademarks